(12) United States Patent
Fan et al.

US007033517B1

(10) Patent No.: US 7,033,517 B1
(45) Date of Patent: Apr. 25, 2006

(54) METHOD OF FABRICATING A LEADLESS PLASTIC CHIP CARRIER

(75) Inventors: Chun Ho Fan, Sham Tseng (HK); Mohan Kirloskar, Cupertino, CA (US)

(73) Assignee: ASAT Ltd., Tsuen Wan (HK)

( * ) Notice: Subject to any disclaimer, the term of this patent is extended or adjusted under 35 U.S.C. 154(b) by 171 days.

(21) Appl. No.: 10/661,480

(22) Filed: Sep. 15, 2003

(51) Int. Cl.
*H01I 13/00* (2006.01)
*B44C 1/22* (2006.01)

(52) U.S. Cl. .................... 216/13; 216/41; 438/686; 257/666

(58) Field of Classification Search ............... 216/13, 216/41; 438/689; 257/666
See application file for complete search history.

(56) References Cited

U.S. PATENT DOCUMENTS

| | | | |
|---|---|---|---|
| 4,530,152 A | 7/1985 | Roche et al. ................. | 29/588 |
| 4,812,896 A | 3/1989 | Rothgery et al. ............. | 357/70 |
| 5,157,480 A | 10/1992 | McShane et al. ........... | 361/404 |
| 5,200,362 A | 4/1993 | Lin et al. .................... | 437/207 |
| 5,200,809 A | 4/1993 | Kwon ......................... | 257/707 |
| 5,214,845 A | 6/1993 | King et al. .................. | 29/841 |
| 5,216,278 A | 6/1993 | Lin et al. .................... | 257/688 |
| 5,221,642 A | 6/1993 | Burns ......................... | 437/207 |
| 5,273,938 A | 12/1993 | Lin et al. .................... | 437/207 |
| 5,277,972 A | 1/1994 | Sakumoto et al. .......... | 428/355 |
| 5,279,029 A | 1/1994 | Burns ......................... | 29/856 |
| 5,332,864 A | 7/1994 | Liang et al. ................ | 174/52.4 |
| 5,343,076 A | 8/1994 | Katayama et al. .......... | 257/717 |
| 5,406,124 A | 4/1995 | Morita et al. ............... | 257/783 |
| 5,424,576 A | 6/1995 | Djennas et al. ............. | 257/666 |
| 5,457,340 A | 10/1995 | Templeton, Jr. et al. .... | 257/666 |
| 5,474,958 A | 12/1995 | Djennas et al. ............. | 437/211 |
| 5,604,376 A | 2/1997 | Hamburgen et al. ........ | 257/676 |
| 5,608,267 A | 3/1997 | Mahulikar et al. .......... | 257/796 |
| 5,639,990 A | 6/1997 | Nishihara et al. .......... | 174/52.2 |
| 5,640,047 A | 6/1997 | Nakashima ................. | 257/738 |
| 5,641,997 A | 6/1997 | Ohta et al. .................. | 257/788 |
| 5,646,831 A | 7/1997 | Manteghi .................... | 361/813 |
| 5,650,663 A | 7/1997 | Parthasarathi .............. | 257/706 |
| 5,682,806 A | 11/1997 | Kretzschmar ............... | 428/343 |
| 5,696,666 A | 12/1997 | Miles et al. ................. | 361/764 |

(Continued)

FOREIGN PATENT DOCUMENTS

JP 59-208756 11/1984

*Primary Examiner*—Shamim Ahmed
(74) *Attorney, Agent, or Firm*—Mayer Brown Rowe & Maw LLP

(57) ABSTRACT

A leadless plastic chip carrier is fabricated by partially etching at least a first surface of a leadframe strip to partially define a die attach pad, a plurality of contact pads disposed around the die attach pad, and a plurality of bond fingers intermediate the die attach pad and the contact pads. A metal strip is laminated to the first surface of the leadframe strip. A second surface of the leadframe strip is selectively etched such that portions of the leadframe strip are removed to define a remainder of the die attach pad, the plurality of contact pads, the plurality of bond fingers and circuitry between ones of the bond fingers and ones the contact pads. A semiconductor die is mounted to the die attach pad and wire bonds connect the semiconductor die to ones of the bond fingers. The second surface of the leadframe strip, the semiconductor die and the wire bonds are encapsulated in a molding material. The metal strip is removed from the first surface of the leadframe strip and the leadless plastic chip carrier is singulated from a remainder of the leadframe strip.

16 Claims, 5 Drawing Sheets

U.S. PATENT DOCUMENTS

| | | | |
|---|---|---|---|
| 5,701,034 A | 12/1997 | Marrs | 257/706 |
| 5,710,064 A | 1/1998 | Song et al. | 437/220 |
| 5,710,695 A | 1/1998 | Manteghi | 361/813 |
| 5,894,108 A | 4/1999 | Mostafazadeh et al. | 174/52.4 |
| 5,976,912 A | 11/1999 | Fukutomi et al. | 438/110 |
| 6,001,671 A | 12/1999 | Fjelstad | 438/112 |
| 6,229,200 B1 | 5/2001 | Mclellan et al. | 257/666 |
| 6,498,099 B1 | 12/2002 | McLellan et al. | 438/689 |
| 6,812,552 B1* | 11/2004 | Islam et al. | 257/666 |
| 6,872,661 B1* | 3/2005 | Kwan et al. | 438/689 |
| 2002/0041019 A1* | 4/2002 | Gang | 257/678 |

* cited by examiner

METHOD OF FABRICATING A LEADLESS PLASTIC CHIP CARRIER

FIELD OF THE INVENTION

The present invention relates in general to integrated circuit packaging, and more particularly to an improved leadless plastic chip carrier including circuitry and etch back pad singulation.

BACKGROUND OF THE INVENTION

According to well known prior art IC (integrated circuit) packaging methodologies, semiconductor dice are singulated and mounted using epoxy or other conventional means onto respective die attach pads of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the package density of such prior art devices.

In order to overcome these and other disadvantages of the prior art, the Applicants previously developed a Leadless Plastic Chip Carrier (LPCC). According to Applicants' LPCC fabrication methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold in which the bottom cavity is a flat plate. In the resulting molded package, the die pad and leadframe inner leads are exposed. By exposing the bottom of the die attach pad, mold delamination at the bottom of the die attach pad is inhibited, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing design flexibility over prior art packages (i.e. custom trim tools and form tools are not required). These and several other advantages of Applicants' own prior art LPCC process are detailed in Applicants' U.S. Pat. No. 6,229,200, issued May 8, 2001, the contents of which are incorporated herein by reference.

Applicant's LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern formed by fiducial marks on the second side (bottom) of the leadframe strip. Also, special mold processing techniques are used to prevent the mold from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicant's own U.S. Pat. No. 6,498,099, issued Dec. 24, 2002, the contents of which are incorporated herein by reference, a localized etch process is provided for the improved manufacture of the LPCC IC package. The leadframe strip is subjected to a partial etch on one or both of the top and bottom sides in order to create a pattern of contact pads and a die attach pad.

Further improvements in IC packages are driven by industry demands for increased thermal and electrical performance and decreased size and cost of manufacture. Thus, improvements resulting in increased thermal and electrical performance and decreased size and cost of manufacture are desirable.

SUMMARY OF THE INVENTION

In one aspect of the present invention, there is provided a method for fabricating a leadless plastic chip carrier, including partially etching at least a first surface of a leadframe strip to partially define a die attach pad, a plurality of contact pads disposed around the die attach pad, and a plurality of bond fingers intermediate the die attach pad and the contact pads. A metal strip is laminated to the first surface of the leadframe strip. A second surface of the leadframe strip is selectively etched such that portions of the leadframe strip are removed to define a remainder of the die attach pad, the plurality of contact pads, the plurality of bond fingers and circuitry between ones of the bond fingers and ones the contact pads. A semiconductor die is mounted to the die attach pad and wire bonds connect the semiconductor die to ones of the bond fingers. The second surface of the leadframe strip, the semiconductor die and the wire bonds are encapsulated in a molding material. The metal strip is removed from the first surface of the leadframe strip and the leadless plastic chip carrier is singulated from a remainder of the leadframe strip.

In another aspect of the present invention, there is provided a process for fabricating a leadless plastic chip carrier, including partially etching at least a first surface of a leadframe strip to partially define a die attach pad, a plurality of contact pads disposed around the die attach pad, and a plurality of bond fingers intermediate the die attach pad and the contact pads. An etch-resist is deposited on a second surface of the leadframe strip, at the die attach pad, the plurality of contact pads, the plurality of bond fingers and circuitry between ones of the bond fingers and ones of the contact pads. A pre-plated metal strip is laminated to the first surface of the leadframe strip. The second surface of the leadframe strip is selectively etched such that portions of the leadframe strip are removed to define a remainder of the die attach pad, the plurality of contact pads, the plurality of bond fingers and the circuitry. A semiconductor die is mounted to the die attach pad and wire bonds connect the semiconductor die to ones of the bond fingers. The second surface of the leadframe strip, the semiconductor die and the wire bonds are encapsulated in a moulding material and the metal strip is removed from the first surface of the leadframe strip. The leadless plastic chip carrier is singulated from a remainder of the leadframe strip.

In another aspect of the present invention, there is provided a process for fabricating a leadless plastic chip carrier, including partially etching at least a first surface of a leadframe strip to partially define a die attach pad, a plurality of contact pads disposed around the die attach pad, and a plurality of bond fingers intermediate the die attach pad and the contact pads. A pre-plated metal strip is laminated to the first surface of the leadframe strip. An etch-resist is then deposited on a second surface of the leadframe strip, at the die attach pad, the plurality of contact pads, the plurality of bond fingers and circuitry between ones of the bond fingers and ones of the contact pads. The second surface of the leadframe strip is selectively etched such that portions of the leadframe strip are removed to define a remainder of the die attach pad, the plurality of contact pads, the plurality of bond fingers and the circuitry. Next, the leadframe strip is selectively plated with Ag or Ni/Au or Ni/Pd onto at least the bond fingers. A semiconductor die is mounted to the die attach pad and wire bonds connect ones of the bond fingers. The second surface of the leadframe strip, the semiconductor die and the wire bonds are encapsulated in a molding material and the metal strip is removed from the first surface of the leadframe strip. The leadless plastic chip carrier is singulated from a remainder of the leadframe strip.

In still another aspect of the present invention, there is provided a leadless plastic chip carrier including a die attach pad, a plurality of contact pads disposed around said die attach pad, a plurality of bond fingers intermediate said die attach pad and said contact pads, circuitry extending between ones of the bond fingers and ones of the contact pads, a semiconductor die mounted to a first surface of said die attach pad, a plurality of wire bonds between the semiconductor die and ones of said bond fingers, and an encapsulant covering said second surface of said leadframe strip, said semiconductor die and said wire bonds in a molding material.

Advantageously, wire bonds extend between the semiconductor die and ones of the bond fingers intermediate the semiconductor die and contact pads. Thus, the wire bond length is less than that of prior art packages, resulting in decreased electrical impedance and increased thermal performance. Further, the present invention provides a leadframe strip manufactured at relatively low cost compared to substrates used in conventional BGA (Ball Grid Array) packages. Also, because the packages, including the contacts, are isolated prior to singulation, gang testing is possible as multiple packages can be tested prior to singulating each individual package from the leadframe strip.

BRIEF DESCRIPTION OF THE DRAWINGS

The present invention will be better understood with reference to the drawings and the following description, in which like numeral denote like parts and.

DETAILED DESCRIPTION OF THE PREFERRED EMBODIMENTS

Figure 1A:
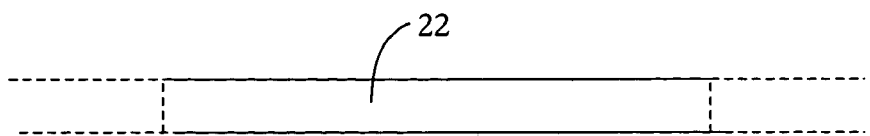
FIGS. 1 to 10 show process steps for fabricating a leadless plastic chip carrier (LPCC) in accordance with an embodiment of the present invention.

Reference is first made to FIGS. 1 to 10 to describe a process for fabricating a leadless plastic chip carrier integrated circuit package, referred to herein as a LPCC package and indicated generally by the numeral 20, according to one embodiment of the present invention. The process includes partially etching at least a first surface of a leadframe strip 22 to partially define a die attach pad 24, a plurality of contact pads 26 disposed around the die attach pad 24, and a plurality of bond fingers 28 intermediate the die attach pad 24 and the contact pads 26. A plated metal strip 30 is laminated to the first surface of the leadframe strip 22. A second surface of the leadframe strip 22 is selectively etched such that portions of the leadframe strip 33 are removed to define a remainder of the die attach pad 24, the plurality of contact pads 26, the plurality of bond fingers 28 and circuitry 32 between ones of the bond fingers 28 and ones the contact pads 26. A semiconductor die 34 is mounted to the die attach pad 24 and the semiconductor die 34 is wire bonded to ones of the bond fingers 28. The second surface of the leadframe strip 22, the semiconductor die 34 and the bond wires 36 are encapsulated in a molding material 38. The metal strip 30 is removed from the first surface of the leadframe strip 22 and the leadless plastic chip carrier 20 is singulated from a remainder of the leadframe strip 22.

Figure 1B:
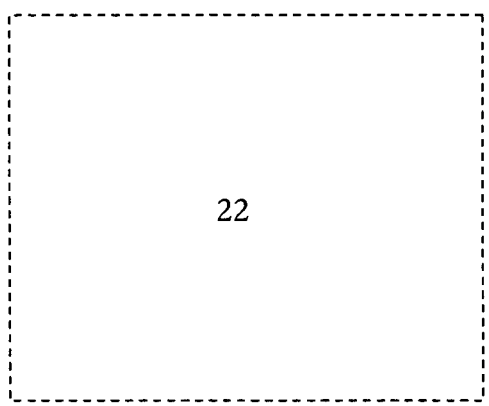
Figure 1C:
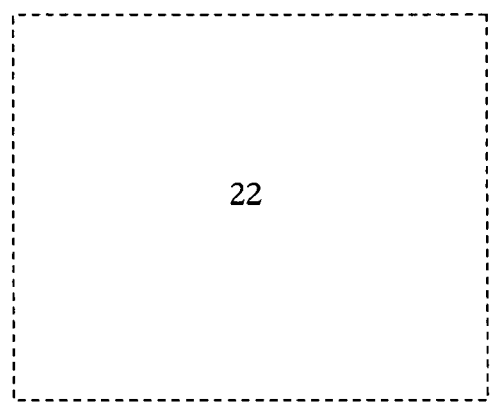

The process for manufacturing the LPCC package 20, according to an embodiment of the present invention, will now be described in more detail. Referring to FIGS. 1A, 1B and 1C, there is provided an elevation view, a first side view and a second side view, respectively, of a copper panel substrate which forms the raw material of the leadframe strip 22. As discussed in greater detail in Applicants' own U.S. Pat. No. 6,229,200, issued May 8, 2001, the leadframe strip 22 is divided into a plurality of sections, each of which incorporates a plurality of leadframe units in an array (e.g. 3×3 array, 5×5 array, etc.). Only one such unit is depicted in the views of FIGS. 1A, 1B and 1C. Portions of adjacent units are indicated in FIG. 1A by stippled lines.

Figure 2A:
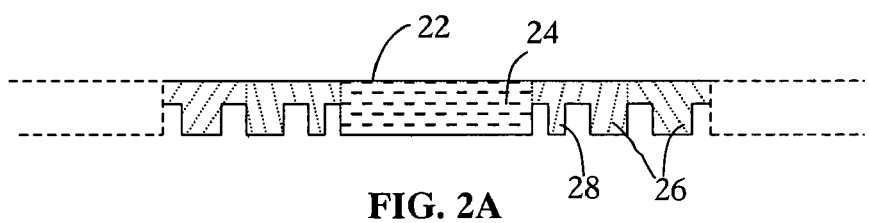
Figure 2B:
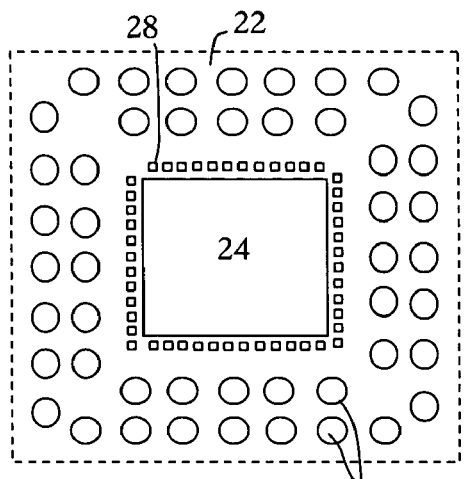
Figure 2C:
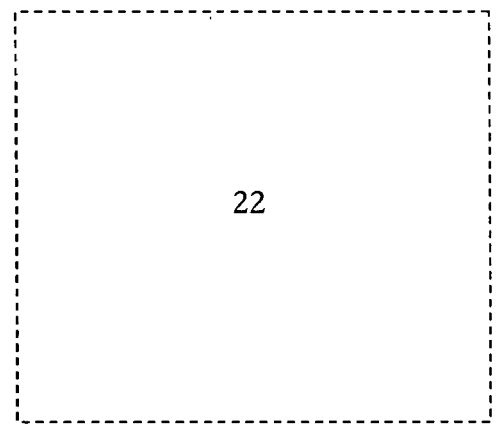

The leadframe strip 22 is subjected to a partial etch on the first side thereof to partially define the die attach pad 24, the plurality of contact pads 26 disposed around the die attach pad 24, and the plurality of bond fingers 28. FIGS. 2A, 2B and 2C show an elevation view, a first side view and a second side view, respectively, of the partially etched leadframe strip 22.

Figure 3A:
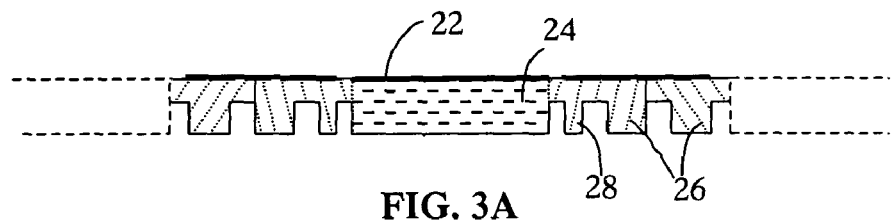
Figure 3B:
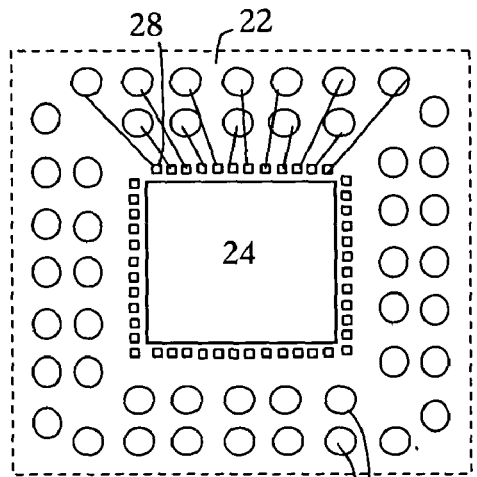
Figure 3C:
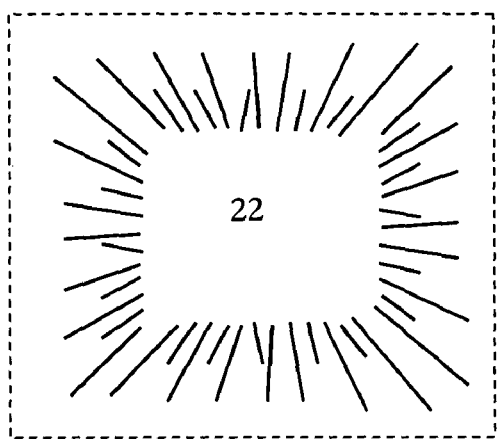

Next, the second side of the leadframe strip 22 is selectively plated with silver (Ag) or nickel then gold (Ni/Au) or nickel then palladium (Ni/Pd) at the locations of the die attach pad 24, the contact pads 26, the bond fingers 28 and circuitry between the bond fingers 28 and the contact pads 26. The plating acts as an etch-resist metal for certain chemicals such as alkali etchant, and facilitates wire bonding. FIGS. 3A, 3B and 3C show an elevation view, a first side view and a second side view, respectively, of the selectively plated leadframe strip 22.

Figure 4A:
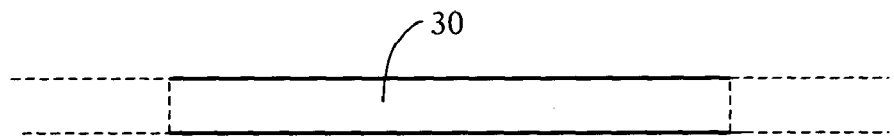
Figure 4B:
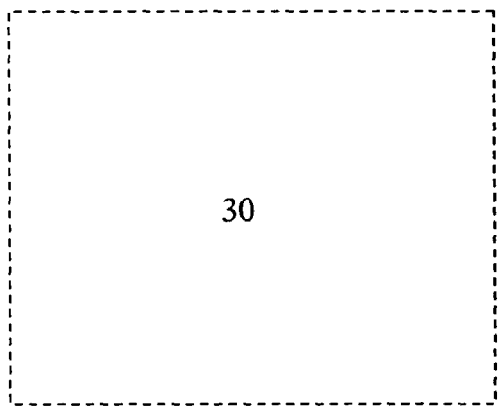
Figure 4C:
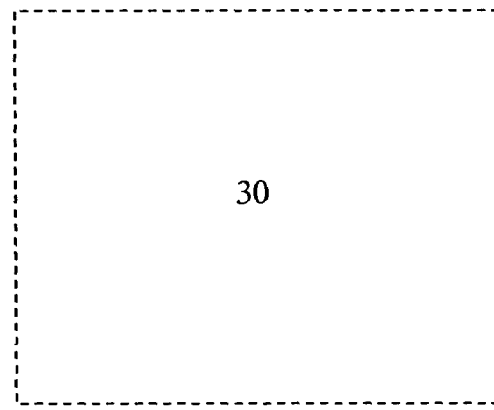

A separate metal strip 30 is then plated with tin (Sn) or solder on both the first and second sides (top and bottom) thereof. FIGS. 4A, 4B and 4C show an elevation view, a first side view and a second side view, respectively, of the plated metal strip 30. It will be understood that the metal strip 30 is suitably sized and shaped to mate with the leadframe strip 22, as described below. Only a portion of the metal strip 30 is shown in FIGS. 4A, 4B and 4C, a remainder of the strip being indicated by stippled lines in FIG. 4A.

Figure 5A:
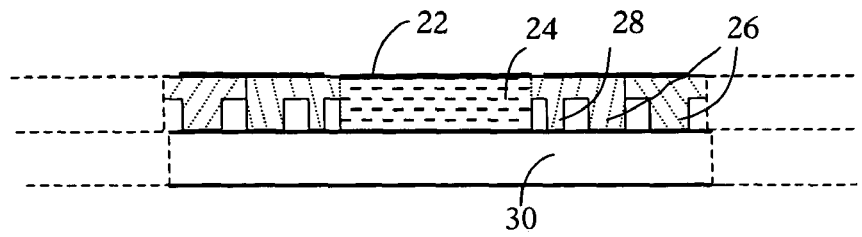
Figure 5B:
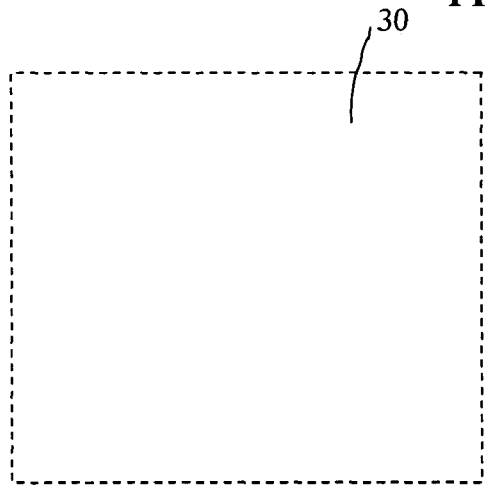
Figure 5C:
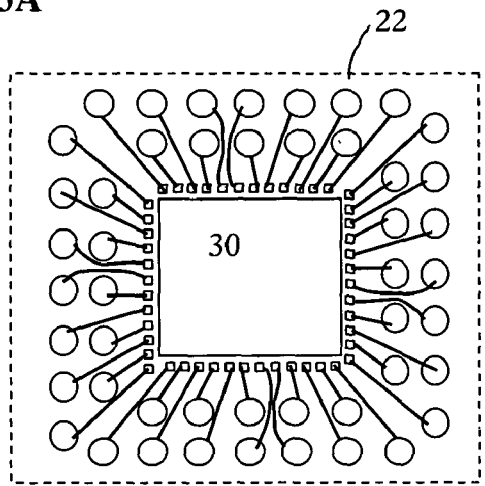

The metal strip 30 is laminated to the first side of the leadframe strip 22 by rolling the metal strip 30 and the leadframe strip 22 together at a controlled temperature and pressure with a suitable flux and forming gas. FIGS. 5A, 5B and 5C show an elevation view, a first side view and a second side view, respectively, of the metal strip 30 laminated to the leadframe strip 22.

Figure 6A:
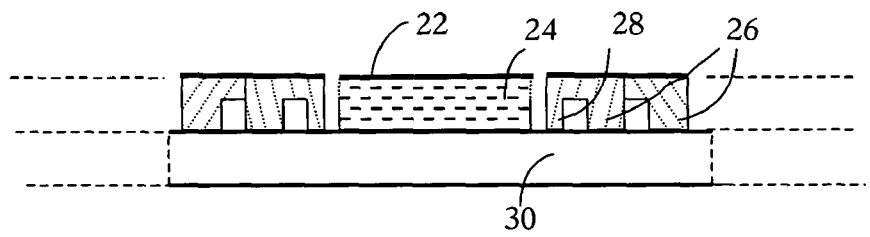
Figure 6B:
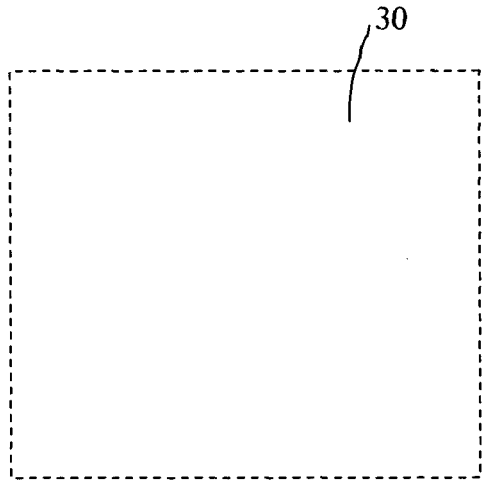
Figure 6C:
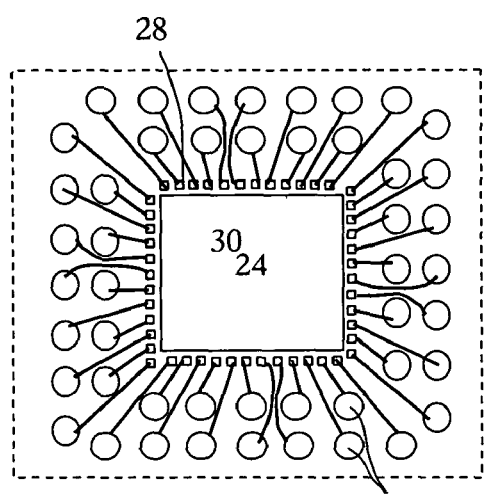

The second side of the leadframe strip 22 is selectively etched using a horizontal panel etch process to etch only on one side thereof. The etch process causes removal of portions of the leadframe strip 22, thereby defining the remainder of the die attach pad 24, the contact pads 26, the bond fingers 28 and the circuitry 32. As indicated hereinabove, the selectively plated metal on the second side of the leadframe strip 22 acts as an etch-resist, thereby inhibiting etching away of the die attach pad 24, contact pads 26, bond fingers 28 and circuitry. FIGS. 6A, 6B and 6C show an elevation view, a first side view and a second side view, respectively, of the selectively etched leadframe strip 22 including the laminated metal strip 30.

Figure 7A:
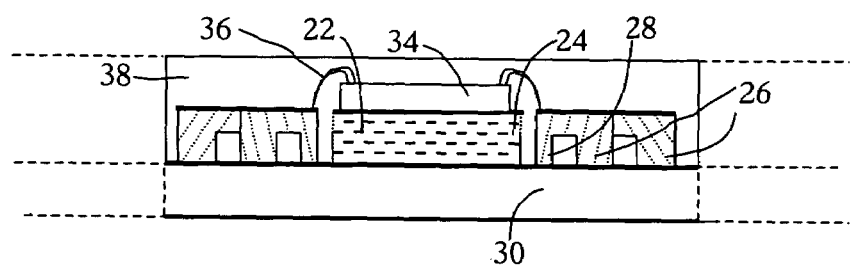
Figure 7B:
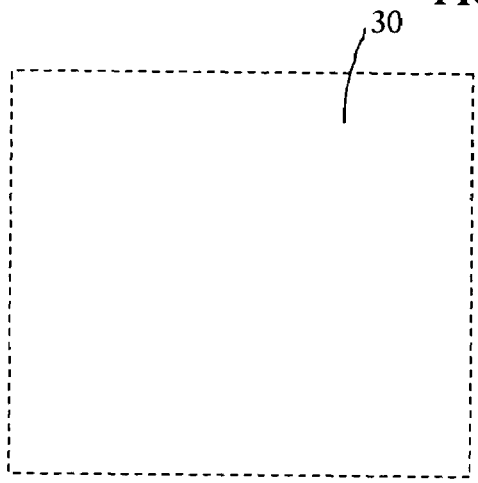
Figure 7C:
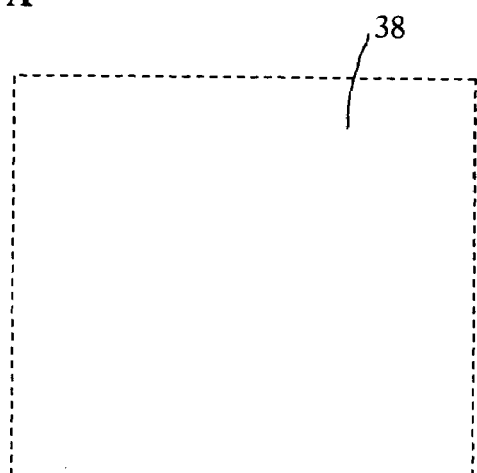

A singulated semiconductor die 34 is conventionally mounted via epoxy (or other suitable means) to the die attach pad 24, and the epoxy is cured. Wires 36 are then bonded between the semiconductor die 34 and the bond fingers 28. It will be appreciated that ones of the bond fingers 28 are electrically connected with ones of the contact pads 26 via the circuitry 32 and thus, the semiconductor die 34 is electrically connected with ones of the contact pads 26. The leadframe strip 22 with the laminated metal strip 30, is then molded in a modified mold with the bottom cavity being a flat plate, followed by curing of the molding material 38, as discussed in Applicants' U.S. Pat. No. 6,229,200. The second surface of the leadframe strip 22, the semiconductor die 34 and the wires 36 are thereby encapsulated in the molding material 38. FIGS. 7A, 7B and 7C show an elevation view, a first side view and a second side view, respectively, of the molded leadframe strip 22 with the laminated metal strip 30.

Figure 8A:
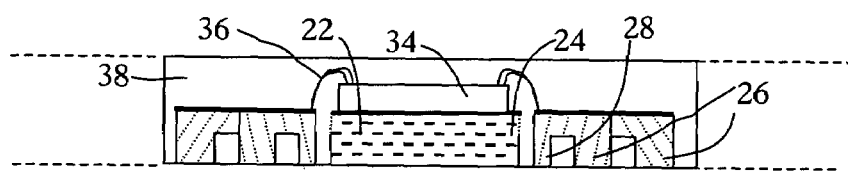
Figure 8B:
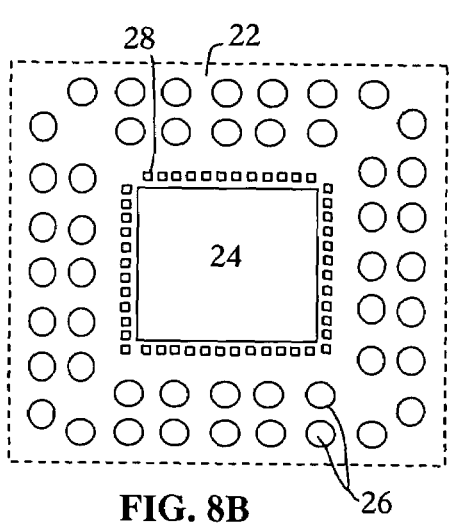
Figure 8C:
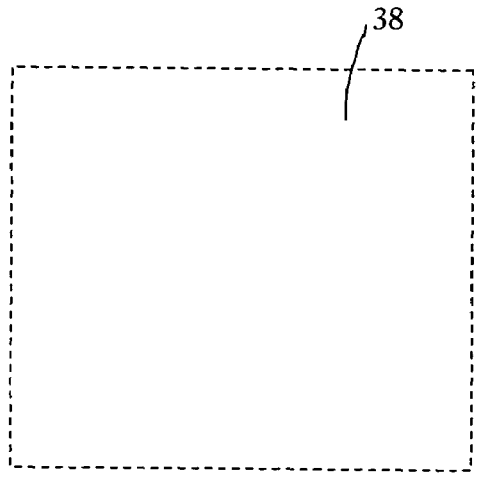

The laminated metal strip 30 is then removed from the leadframe strip 22 by separating the two at increased temperature and pressure. Thus, the die attach pad 24, the contact pads 26 and the bond fingers 28 are exposed. FIGS. 8A, 8B and 8C show an elevation view, a first side view and a second side view, respectively, of the leadframe strip 22 after removal of the metal strip 30.

Figure 9A:
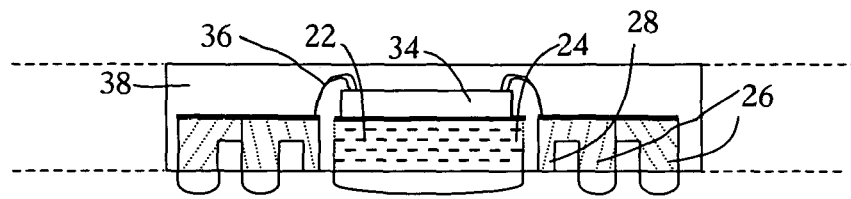
Figure 9B:
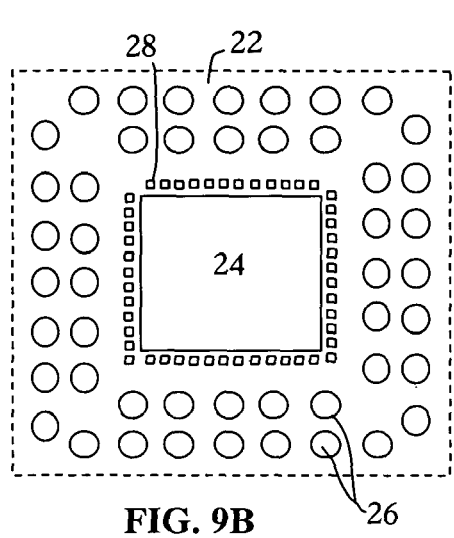
Figure 9C:
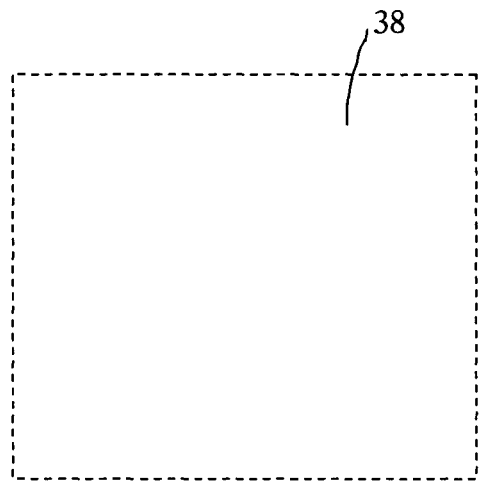

Next, solder balls 40 are reflowed on the die attach pad 24 and the contact pads 26 that were exposed when the metal strip 30 was removed from the leadframe strip 22. FIGS. 9A, 9B and 9C show an elevation view, a first side view and a second side view, respectively of the leadframe strip 22 after reflow of the solder balls.

Figure 10A:
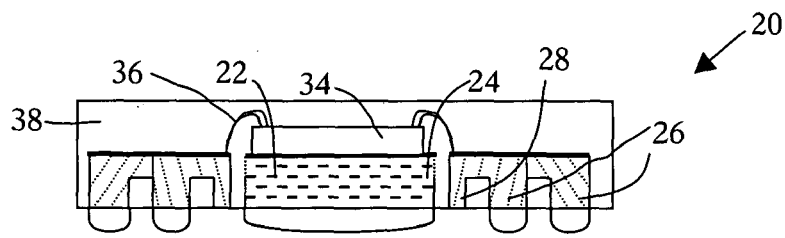
Figure 10B:
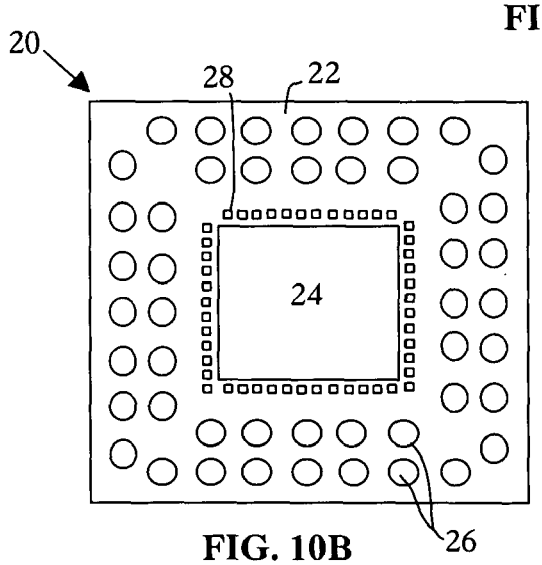
Figure 10C:
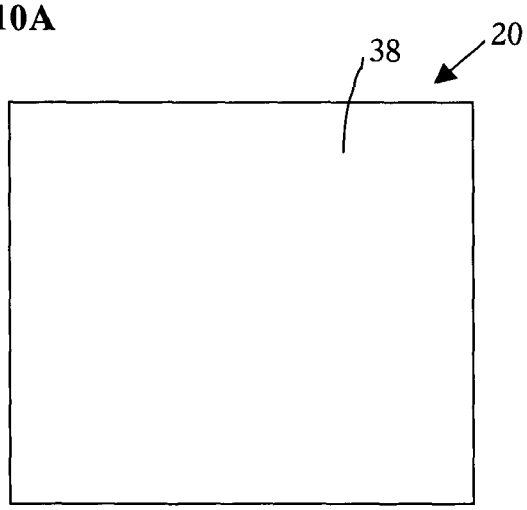

The individual LPCC packages 20 are then singulated by, for example, saw singulation. FIGS. 10A, 10B and 10C show an elevation view, a first side view and second side view, respectively of one singulated LPCC package 20.

A specific embodiment of the present invention has been shown and described herein. However, modifications and variations to this embodiment are possible. For example, the size and shape of many of the features of the LPCC package can vary while still performing the same function. Also, the process order can vary while still providing a similar package. Other leadframe materials are possible such as iron-based alloys. Rather than finishing the contacts and die attach pad by reflowing solder balls on the die attach pad and the contact pads that were exposed when the metal strip was removed from the leadframe strip, solder paste can be printed on the die attach pad and the contact pads, solder can be barrel plated on, or chemically passivated copper can be used for contact and die attach pad finishing. Other methods of singulation are also possible, including die punching. Those skilled in the art my conceive of still other modifications and variations. These alternatives and others are believed to be within the scope and sphere of the present invention.

What is claimed is:

1. A process for fabricating a leadless plastic chip carrier, comprising:
    partially etching at least a first surface of a leadframe strip to partially define a die attach pad, a plurality of contact pads disposed around said die attach pad, and a plurality of bond fingers intermediate said die attach pad and said contact pads;
    laminating a metal strip to the first surface of said leadframe strip;
    selectively etching a second surface of said leadframe strip opposite to said first surface such that portions of the leadframe strip are removed to define a remainder of said die attach pad, said plurality of contact pads, said plurality of bond fingers and circuitry between ones of said bond fingers and ones said contact pads;
    mounting a semiconductor die to said die attach pad;
    wire bonding said semiconductor die to ones of said bond fingers;
    encapsulating said second surface of said leadframe strip, said semiconductor die and said wire bonds in a molding material;
    removing said metal strip from said first surface of said leadframe strip; and
    singulating said leadless plastic chip carrier from a remainder of said leadframe strip.

2. The process according to claim 1, further comprising depositing an etch-resist metal on said second surface of said leadframe strip, at said die attach pad, said plurality of contact pads, said plurality of bond fingers and said circuitry, prior to selectively etching.

3. The process according to claim 1, further comprising selectively depositing an etch-resist on said second surface of said leadframe strip, at said die attach pad, said plurality of contact pads, said plurality of bond fingers and said circuitry, prior to laminating.

4. The process according to claim 3, wherein selectively depositing said etch resist comprises selectively depositing one of silver, nickel and then gold, and nickel and then palladium.

5. The process according to claim 1, wherein said metal strip is a plated metal strip.

6. The process according to claim 1, wherein further comprising plating first and second surfaces of said metal strip prior to laminating.

7. The process according to claim 5, wherein said plating comprises plating one of tin and solder on first and second surfaces.

8. The process according to claim 1, wherein laminating comprises rolling of said metal strip with said leadframe strip, at a controlled temperature and pressure and with a flux.

9. The process according to claim 1, wherein laminating comprises hot rolling said metal strip with said leadframe strip, at a controlled temperature and pressure, with a flux and forming gas.

10. The process according to claim 1, further comprising attaching solder balls to said contact pads exposed as a result of removing said metal strip from said first surface of said leadframe strip.

11. The process according to claim 1, further comprising applying solder to said contact pads and said die attach pad exposed as a result of removing said metal strip from said first surface of said leadframe strip.

12. The process according to claim 11, wherein said applying comprises reflowing solder balls on said contact pads and said die attach pad.

13. The process according to claim 11, wherein said applying comprises printing solder paste on said contact pads and said die attach pad.

14. A process for fabricating a leadless plastic chip carrier, comprising:
    partially etching at least a first surface of a leadframe strip to partially define a die attach pad, a plurality of contact pads disposed around said die attach pad, and a plurality of bond fingers intermediate said die attach pad and said contact pads;

depositing an etch-resist on a second surface of said leadframe strip, at said die attach pad, said plurality of contact pads, said plurality of bond fingers and circuitry between ones of said bond fingers and ones of said contact pads;

laminating a pre-plated metal strip to the first surface of said leadframe strip;

selectively etching said second surface of said leadframe strip opposite to said first surface such that portions of the leadframe strip are removed to define a remainder of said die attach pad, said plurality of contact pads, said plurality of bond fingers and said circuitry:

mounting a semiconductor die to said die attach pad;

wire bonding said semiconductor die to ones of said bond fingers;

encapsulating said second surface of said leadframe strip, said semiconductor die and said wire bonds in a molding material;

removing said metal strip from said first surface of said leadframe strip; and singulating said leadless plastic chip carrier from a remainder of said leadframe strip.

15. A process for fabricating a leadless plastic chip carrier, comprising:

partially etching at least a first surface of a leadframe strip to partially define a die attach pad, a plurality of contact pads disposed around said die attach pad, and a plurality of bond fingers intermediate said die attach pad and said contact pads;

laminating a pre-plated metal strip to the first surface of said leadframe strip;

depositing an etch-resist on a second surface of said leadframe strip, at said die attach pad, said plurality of contact pads, said plurality of bond fingers and circuitry between ones of said bond fingers and ones of said contact pads;

selectively etching said second surface of said leadframe strip such that portions of the leadframe strip are removed to define a remainder of said die attach pad, said plurality of contact pads, said plurality of bond fingers and said circuitry;

selectively plating metal onto at least the bond fingers;

mounting a semiconductor die to said die attach pad;

wire bonding said semiconductor die to ones of said bond fingers;

encapsulating said second surface of said leadframe strip opposite to said first surface, said semiconductor die and said wire bonds in a molding material;

removing said metal strip from said first surface of said leadframe strip; and singulating said leadless plastic chip carrier from a remainder of said leadframe strip.

16. The process according to claim 14, wherein selectively plating metal onto at least the bond fingers comprises selectively plating at least one of Ag, Ni/Au or Ni/Pd onto the bond fingers.

* * * * *